United States Patent
Yoo et al.

(10) Patent No.: US 12,270,118 B2
(45) Date of Patent: Apr. 8, 2025

(54) SUBSTRATE SUPPORTING PLATE, THIN FILM DEPOSITION APPARATUS INCLUDING THE SAME, AND THIN FILM DEPOSITION METHOD

(71) Applicant: ASM IP Holding B.V., Almere (NL)

(72) Inventors: Yong Min Yoo, Cheonan-si (KR); Seung Woo Choi, Hwaseong-si (KR); Dong Seok Kang, Cheonan-si (KR); Jong Won Shon, Seoul (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/414,914

(22) Filed: Jan. 17, 2024

(65) Prior Publication Data

US 2024/0158942 A1  May 16, 2024

Related U.S. Application Data

(63) Continuation of application No. 17/092,599, filed on Nov. 9, 2020, now Pat. No. 11,965,262, which is a
(Continued)

(30) Foreign Application Priority Data

Mar. 17, 2016 (KR) .................. 10-2016-0032079

(51) Int. Cl.
*H01L 21/687* (2006.01)
*C23C 16/44* (2006.01)
(Continued)

(52) U.S. Cl.
CPC .......... *C25D 11/04* (2013.01); *C23C 16/4404* (2013.01); *C23C 16/4409* (2013.01); *C23C 16/4412* (2013.01); *C23C 16/45525* (2013.01); *C23C 16/4583* (2013.01); *C23C 16/5096* (2013.01); *C25D 11/022* (2013.01); *H01J 37/3244* (2013.01); *H01J 37/32715* (2013.01); *H01L 21/6719* (2013.01); *H01L 21/68735* (2013.01); *H01L 21/68757* (2013.01); *H01J 37/32477* (2013.01)

(58) Field of Classification Search
CPC ............ C23C 16/4404; C23C 16/4409; C23C 16/4412; C23C 16/45525; C23C 16/4583; C23C 16/5096; C25D 11/04; C25D 11/022; H01J 37/3244; H01J 37/32725; H01J 37/32477; H01L 21/6719; H01L 21/68735; H01L 21/68757
USPC ........................................................ 118/728
See application file for complete search history.

(56) References Cited

U.S. PATENT DOCUMENTS 5,900,064 A * 5/1999 Kholodenko ....... H01L 21/6831
   438/758
5,916,370 A * 6/1999 Chang ............... H01L 21/68757
   118/500

(Continued)

*Primary Examiner* — Charlee J. C. Bennett
(74) *Attorney, Agent, or Firm* — Snell & Wilmer L.L.P.

(57) ABSTRACT

A substrate supporting plate that may prevent deposition on a rear surface of a substrate and may easily unload the substrate. The substrate supporting plate may include a substrate mounting portion and a peripheral portion surrounding the substrate mounting portion. An edge portion of a top surface of the substrate mounting portion may be anodized. A central portion of the top surface of the substrate mounting portion may not be anodized.

20 Claims, 9 Drawing Sheets

Related U.S. Application Data continuation of application No. 15/451,285, filed on Mar. 6, 2017, now Pat. No. 10,876,218.

(51) Int. Cl.

| | |
|---|---|
| *C23C 16/455* | (2006.01) |
| *C23C 16/458* | (2006.01) |
| *C23C 16/509* | (2006.01) |
| *C25D 11/02* | (2006.01) |
| *C25D 11/04* | (2006.01) |
| *H01J 37/32* | (2006.01) |
| *H01L 21/67* | (2006.01) |

(56) References Cited

U.S. PATENT DOCUMENTS

| | | | | |
|---|---|---|---|---|
| 6,530,994 | B1* | 3/2003 | Mahawili | H01L 21/67115 156/345.52 |
| 7,598,150 | B2* | 10/2009 | Ranish | C21D 1/34 219/390 |
| 9,315,896 | B2* | 4/2016 | Pore | H01L 21/02538 |
| 10,854,498 | B2* | 12/2020 | Shoji | H01L 21/6875 |
| 11,450,551 | B2* | 9/2022 | Kim | H01L 21/68721 |
| 11,515,195 | B2* | 11/2022 | Kalita | H01L 21/6708 |
| 2004/0216667 | A1* | 11/2004 | Mitsuhashi | C23C 16/4404 118/715 |
| 2006/0249077 | A1* | 11/2006 | Kim | C23C 16/45519 118/723 MP |
| 2009/0041952 | A1* | 2/2009 | Yoon | H01L 21/02274 427/579 |
| 2013/0026693 | A1* | 1/2013 | Ranish | H01L 21/68735 269/305 |
| 2015/0376780 | A1* | 12/2015 | Khaja | H01L 21/67103 134/1.1 |
| 2016/0049323 | A1* | 2/2016 | Ye | H01L 21/6833 361/234 |
| 2017/0162425 | A1* | 6/2017 | Shinohara | C23C 16/045 |
| 2020/0185203 | A1* | 6/2020 | Lubomirsky | H01J 37/32697 |
| 2020/0411359 | A1* | 12/2020 | AuBuchon | C23C 16/4586 |
| 2021/0040643 | A1* | 2/2021 | Sakaguchi | H01L 21/68771 |

* cited by examiner

SUBSTRATE SUPPORTING PLATE, THIN FILM DEPOSITION APPARATUS INCLUDING THE SAME, AND THIN FILM DEPOSITION METHOD

CROSS-REFERENCE TO RELATED APPLICATIONS

This application is a continuation of, and claims priority to, U.S. patent application Ser. No. 17/092,599 filed Nov. 9, 2020 entitled SUBSTRATE SUPPORTING PLATE, THIN FILM DEPOSITION APPARATUS INCLUDING THE SAME, AND THIN FILM DEPOSITION METHOD; which is a continuation of U.S. patent application Ser. No. 15/451,285, filed Mar. 6, 2017 (now U.S. Pat. No. 10,876,218, issued on Dec. 29, 2020), which claims the benefit of Korean Patent Application No. 10-2016-0032079, filed on Mar. 17, 2016, in the Korean Intellectual Property Office, the disclosures of which are incorporated herein in their entireties by reference.

BACKGROUND

1. Field

One or more embodiments relate to a substrate supporting plate, and more particularly, to a substrate supporting plate, a thin film deposition apparatus including the substrate supporting plate, and a thin film deposition method using the substrate supporting plate.

2. Description of the Related Art

When a semiconductor thin film is deposited, one important factor from among various factors for determining the quality of a thin film is contamination with residual particles in a process.

For example, in a process with a fast switching cycle between a source gas and a reactive gas such as an atomic layer deposition (ALD) process, a gas (e.g., a source gas) that is not removed from a reactor yet may react with another gas (e.g., a reactive gas) and may act as a contaminant in the reactor. The contaminant may penetrate into a device structure on a substrate, thereby leading to a malfunction of a semiconductor device.

In more detail, during the process, the source gas or the reactive gas may penetrate between the substrate and a susceptor, on which the substrate is mounted. Accordingly, the gases may remain, and those may be deposited on a rear surface of the substrate. In this case, the device formed on the substrate may be contaminated, and when the substrate is detached from the susceptor, contamination particles in a reactive space may diffuse and the reactor may also be contaminated.

SUMMARY

One or more embodiments include a substrate supporting plate that may prevent a source gas or a reactive gas from being deposited on a rear surface of a substrate, a thin film deposition apparatus including the substrate supporting plate, and a thin film deposition method using the substrate supporting plate.

Additional aspects will be set forth in part in the description which follows and, in part, will be apparent from the description, or may be learned by practice of the presented embodiments.

According to one or more embodiments, a substrate supporting plate includes: a substrate mounting portion; and a peripheral portion surrounding the substrate mounting portion, wherein an edge portion of a top surface of the substrate mounting portion is anodized, and a central portion of the top surface of the substrate mounting portion is not anodized The substrate supporting plate may further include a substrate supporting pin hole. The substrate supporting pin hole may be formed in the central portion.

The substrate mounting portion may have a concave shape relative to the peripheral portion.

The anodized edge portion may have a thickness ranging from about 10 µm to about 100 µm.

An area of the central portion may be less than an area of a target substrate to be processed.

An insulating layer may be formed on a top surface of the edge portion due to the anodizing. The insulating layer may include aluminum oxide.

At least a part of a bottom surface that is opposite to the top surface may be anodized.

According to one or more embodiments, a thin film deposition apparatus includes: a reactor wall; a gas injection device; a gas channel; a gas flow control device; and a substrate supporting plate, wherein the gas injection device, the gas channel, and the gas flow control device are sequentially stacked and are provided in the reactor wall, wherein the substrate supporting plate includes a top surface, a bottom surface, and a side surface, and an insulating layer is formed on at least a part of the top surface and at least a part of the bottom surface of the substrate supporting plate.

The insulating layer may be further formed on the side surface of the substrate supporting plate.

The insulating layer may protrude from the top surface of the substrate supporting plate.

A gas supplied by the gas channel and the gas injection device may be injected onto a substrate on the substrate supporting plate, wherein at least a part of the injected gas is exhausted through the gas flow control device. The substrate may de disposed to overlap the insulating layer The injected gas may penetrate into a space between the substrate and the substrate supporting plate to form a thin film on a rear surface of the substrate.

The substrate supporting plate may include a substrate mounting portion and a peripheral portion surrounding the substrate mounting portion, wherein the peripheral portion contacts the reactor wall to form a reactive space through face sealing between them.

According to one or more embodiments, a thin film deposition method includes: mounting a target substrate to be processed on the substrate supporting plate; closely attaching the target substrate to the substrate supporting plate by using charges accumulated on the target substrate, while depositing a first thin film on the target substrate; and unloading the target substrate.

The depositing of the first thin film may include: supplying a first gas; removing the first gas that remains by supplying a purge gas; supplying a second gas and plasma; and removing a second gas that remains by supplying the purge gas.

A second thin film may be formed on a rear surface of the target substrate while the first thin film is deposited. A width of the second thin film may be less than a width of an edge excluding portion. For example, when a film is deposited on a 300 mm wafer, a width of the edge excluding portion may be determined to be 3 mm.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
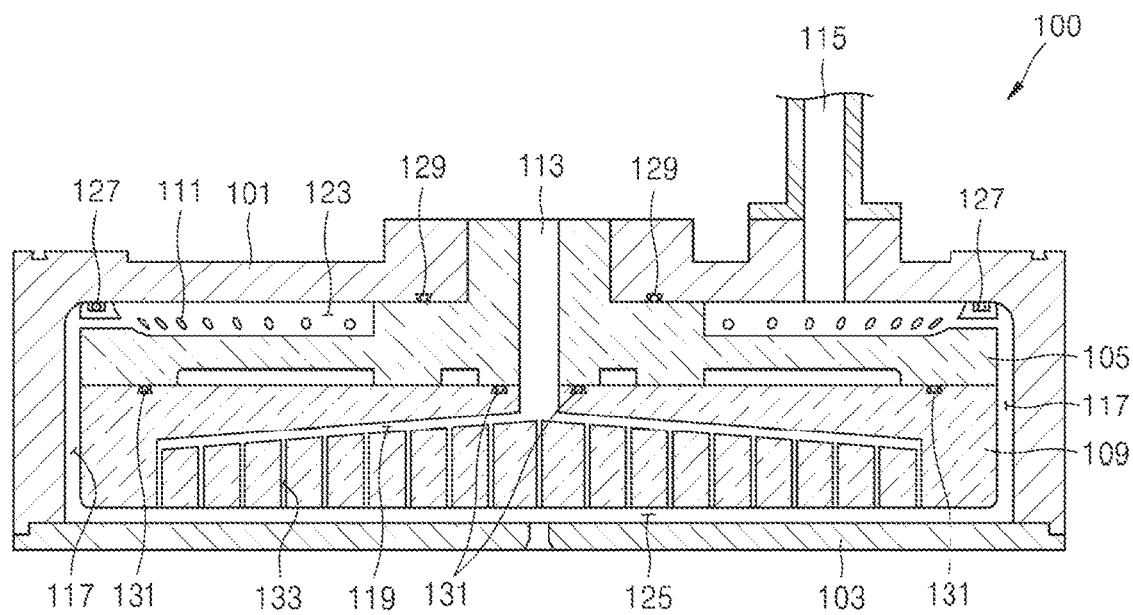
FIG. 1 is a cross-sectional view of a semiconductor manufacturing apparatus according to an embodiment.

The present disclosure will now be described more fully with reference to the accompanying drawings, in which embodiments of the present disclosure are shown.

The present disclosure now will be described more fully hereinafter with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the present disclosure to one of ordinary skill in the art.

The terminology used herein is for the purpose of describing embodiments only and is not intended to be limiting of embodiments of the present disclosure. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, components, and/or groups, but do not preclude the presence or addition of one or more other features, integers, steps, operations, elements, components, and/or groups thereof. As used here, the term "and/or" includes any and all combinations of one or more of the associated listed items.

It will be understood that although the terms "first", "second", etc. may be used herein to describe various members, regions, layers, and/or portions, these members, regions, layers, and/or portions should not be limited by these terms. The terms do not refer to a specific order, vertical relationship, or a preference, and are only used to distinguish one member, region, or portion from another member, region, or portion. Accordingly, a first member, region, or portion which will be described below may refer to a second member, region, or portion without departing from the teaching of the present disclosure.

The present disclosure will now be described more fully with reference to the accompanying drawings, in which embodiments of the present disclosure are shown. In the drawings, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing.

Expressions such as "at least one of" when preceding a list of elements, modify the entire list of elements and do not modify the individual elements of the list.

A deposition apparatus according to an embodiment will now be explained with reference to FIG. 1. FIG. 1 is a cross-sectional view of a semiconductor manufacturing apparatus 100 according to an embodiment. In the semiconductor manufacturing apparatus 100 of FIG. 1, a reactor wall 101 may contact a substrate supporting plate 103. In more detail, a bottom surface of the reactor wall 101 may contact the substrate supporting plate 103 that functions as a lower electrode to form a reaction space 125 between the reactor wall 101 and the substrate supporting plate 103.

In other words, the substrate supporting plate 103 may be configured to contact the reactor wall 101 through face sealing, and the reaction space 125 may be formed between the reactor wall 101 and the substrate supporting plate 103 due to the face sealing. Also, a gas discharge path 117 may be formed between the reactor wall 101 and a gas flow control device 5 and between the reactor wall 101 and a gas supply device 109 due to the face sealing.

The gas flow control device 105 and the gas supply device 109 may be disposed between the reactor wall 101 and the substrate supporting plate 103. The gas flow control device 105 and the gas supply device 109 may be integrally formed with each other, or a portion with gas injection holes 133 may be formed separately. In the latter case, the gas flow control device 105 may be stacked on the gas supply device 109. Optionally, the gas supply device 109 may be separate, and in this case, the gas supply device 109 may include a gas injection device having a plurality of through-holes and a gas channel stacked on the gas injection device (see FIG. 3).

The gas flow control device 105 may include a plate and a side wall 123 that protrudes from the plate. A plurality of through-holes 111 that pass through the side wall 123 may be formed in the side wall 123.

Grooves 127, 129, and 131 for housing a sealing member such as an O-ring may be formed between the reactor wall 101 and the gas flow control device 105 and between the gas flow control device 105 and the gas supply device 109. Due to the sealing member, an external gas may be prevented from being introduced into the reaction space 125. Also, due to the sealing member, a reactive gas in the reaction space 125 may flow along a normal path (i.e., a gas discharge path 117 and a gas outlet 115 (see FIG. 2)). Accordingly, the reactive gas may be prevented from leaking to a portion other than the normal path.

The gas supply device 109 may be used as an electrode in a plasma process such as a capacitively coupled plasma (CCP) method. In this case, the gas supply device 109 may include a metal material such as aluminum (Al). In the CCP method, the substrate supporting plate 103 may be used as an electrode, and thus capacitive coupling may be achieved by the gas supply device 109 that functions as a first electrode and the substrate supporting plate 103 that functions as a second electrode.

Figure 3:
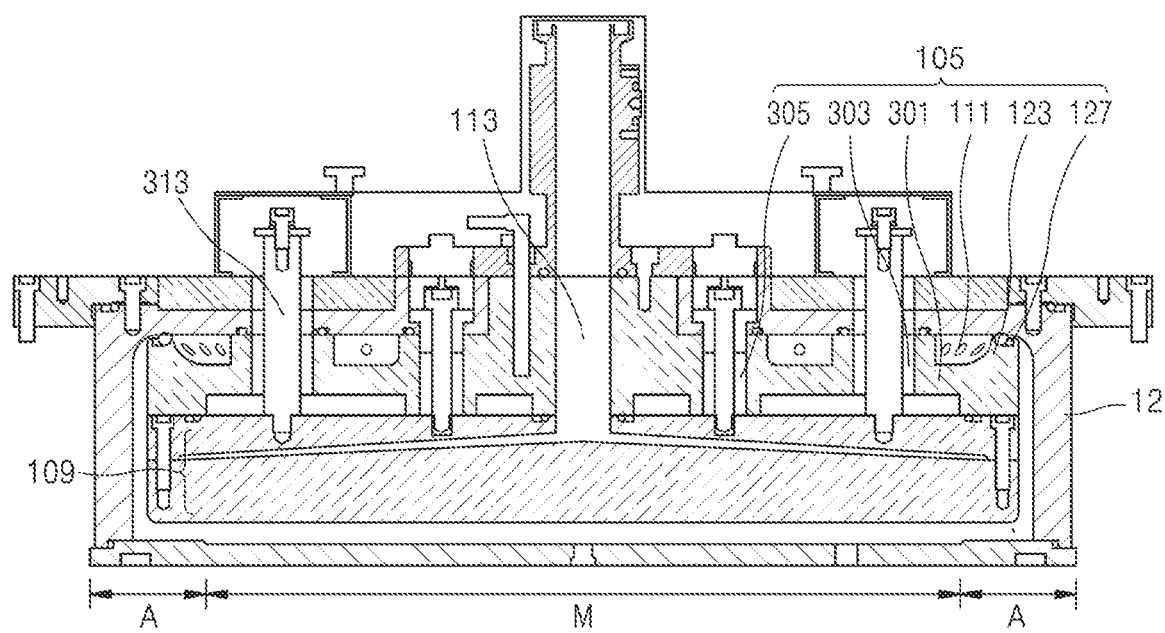
FIG. 3 is a cross-sectional view of the semiconductor manufacturing apparatus according to another embodiment.

In more detail, RF power that is generated by an external plasma generator (not shown) may be transferred to the gas supply device 109 through an RF (radio frequency) rod 313 (see FIG. 3). The RF rod 313 may be mechanically connected to the gas supply device 109 through an RF rod hole 303 (see FIG. 3) that passes through the gas flow control device 105 and an upper portion of the reactor wall 101.

Optionally, the gas supply device 109 may be made of a conductor, whereas the gas flow control device 105 may be made of an insulating material such as ceramic, and thus the gas supply device 109 that is used as a plasma electrode may be insulated from the reactor wall 101.

As shown in FIG. 1, a gas inlet 113 that passes through the reactor wall 101 and a central portion of the gas flow control device 105 is formed in the upper portion of the reactor wall 101. Also, a gas flow path 119 may be additionally formed in the gas supply device 109 so that a reactive gas supplied through the gas inlet 113 by an external gas supply unit (not shown) may be uniformly supplied to the gas injection holes 133 of the gas supply device 109.

Also, as shown in FIG. 1, a gas outlet 115 is provided at an upper end of the reactor wall 1 asymmetrically with respect to the gas inlet 113. Although not shown in FIG. 1, the gas outlet 115 may be symmetric with the gas inlet 113. Also, the gas discharge path 117 through which a residual gas of the reactive gas after a process is discharged may be formed in a space between the reactor wall 101 and the side wall of the gas flow control device 105 (and a side wall of the gas supply device 109) as they are spaced apart from each other.

Figure 2:
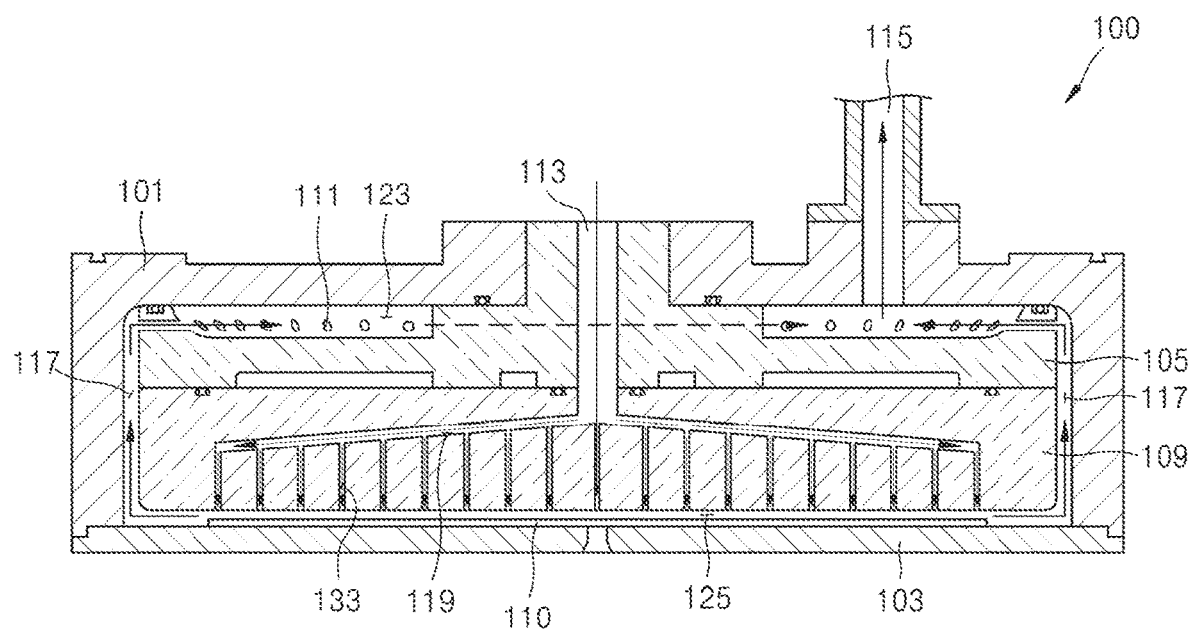
FIG. 2 is a cross-sectional view illustrating the flow of a reactive gas (and a residual gas) in the semiconductor manufacturing apparatus according to an embodiment.

FIG. 2 is a cross-sectional view illustrating the flow of a reactive gas (and a residual gas) in the semiconductor manufacturing apparatus 100 according to an embodiment. An arrow marks a direction in which a gas flows, and a reactive gas supplied through the gas inlet 113 by an external gas supply unit (not shown) may be uniformly supplied through the gas flow path 119 into the gas injection holes 133 formed in a shower head.

A chemical reaction may be performed in the reaction space 125 or on a substrate 110 where the reactive gas exists to form a thin film on the substrate 110. A residual gas after the thin film is formed may pass through the gas discharge path 117 formed between the reactor wall 101 and a side wall of the gas supply device 109, may pass through the through-holes 111 formed in the side wall 123 of the gas flow control device 105, may be introduced into an inner space of the gas flow control device 105, and then may be discharged to the outside through the gas outlet 115.

FIG. 3 is a cross-sectional view of the semiconductor manufacturing apparatus 100 according to another embodiment. Referring to FIG. 3, the gas flow control device 105 includes the side wall 123, the gas inlet 113, a plate 301 surrounded by the side wall 123, RF rod holes 303, screw holes 305, the through-holes 111, and the groove 127 for receiving a sealing member such as an O-ring.

The plate 301 may be surrounded by the side wall 123 that protrudes so that the plate 301 has a concave shape. The gas inlet 113 through which an external reactive gas is introduced is disposed in a portion of the gas flow control device 105. At least two screw holes 305 are formed around the gas inlet 113, and screws that are mechanical connection members for connecting the gas flow control device 105 and the gas supply device 109 pass through the screw holes 305. The RF rod holes 303 are formed in another portion of the gas flow control device 105 so that the RF rods 313 that are connected to an external plasma supply unit (not shown) are connected to the gas supply device 109 that is located under the gas flow control device 105.

The gas supply device 109 connected to the RF rods 313 may function as an electrode in a plasma process using a CCP method. In this case, a gas supplied by a gas channel and a gas injection device of the gas supply device 109 may be activated by the gas supply device 109 that functions as an electrode and may be injected onto the substrate 110 on the substrate supporting plate 103.

Figure 4:
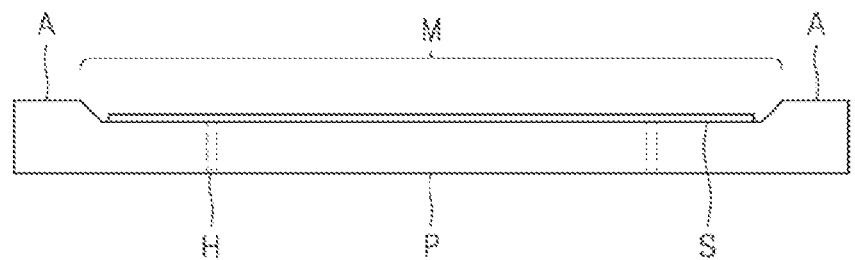
FIG. 4 is a cross-sectional view of a substrate supporting plate according to a related art.

FIG. 4 is a cross-sectional view of a substrate supporting plate P according to a related art.

Referring to FIG. 4, the substrate supporting plate P may include a peripheral portion A and a substrate mounting portion M, and a substrate supporting pin hole H may be formed in the substrate supporting plate P. The substrate mounting portion M may be concave from the peripheral portion A. An inner side wall of the substrate mounting portion M may have an inclined shape (i.e., a concave shape) so that a substrate is accurately located in a concave space.

The substrate supporting pin hole H through which a substrate supporting pin enters may be formed in the substrate supporting plate P such as a susceptor in order to load/unload the substrate. The peripheral portion A may contact the reactor wall 101 (see FIG. 1) through face sealing to provide a face for forming a reaction space, as shown in FIGS. 1 through 3.

Figure 5:
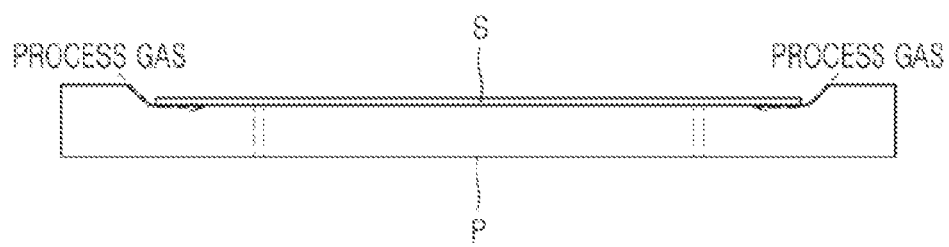
FIG. 5 is a cross-sectional view illustrating a case where a process gas penetrates into a rear surface of a target substrate to be processed when deposition is performed on the substrate supporting plate in a reactive space according to a related art.

FIG. 5 is a cross-sectional view illustrating a case where a process gas penetrates into a rear surface of a target substrate when deposition is performed on the substrate supporting plate P in a reaction space according to a related art.

Referring to FIG. 5, even when the target substrate S is mounted on the substrate supporting plate P such as a susceptor and is closely attached to the substrate supporting plate P, a process gas may penetrate into an edge portion of the rear surface of the target substrate S. In more detail, a source gas and/or a reactive gas may penetrate to a depth of 10 mm through the edge portion of the target substrate S to remain on a rear surface of the target substrate S. The residual gas remaining on the rear surface may act as a contaminant in a reactor, in addition to contaminating a device structure on the target substrate S in a subsequent process, thereby degrading the quality of a semiconductor device.

In a semiconductor manufacturing apparatus according to an embodiment, the above problems are solved by anodizing a substrate supporting plate such as a susceptor, in other words, by forming a thin oxide film on a surface of a metal.

In more detail, according to some embodiments, a portion of a substrate supporting plate that contacts a substrate is anodized so that the substrate supporting plate is closely attached to the substrate, and only a part of the substrate supporting plate is anodized so that the substrate is easily detached after a process ends. Only an edge portion of the substrate supporting plate that contacts the substrate may be anodized.

As such, since a top surface of a substrate supporting plate is anodized, an adhesive force between the substrate supporting plate and a substrate during a plasma process may increase, and thus a process gas may be prevented from penetrating into a rear surface of the substrate during a process. Also, since only a part of the substrate supporting plate is anodized, the substrate may be easily detached after the process.

In more detail, in a plasma process such as a plasma-enhanced atomic layer deposition (PE-ALD) process, when an entire top surface of a substrate supporting plate is anodized, a substrate is attached to the substrate supporting plate due to RF charges accumulated on the substrate. In this case, even after the plasma process ends, the substrate attached to the substrate supporting plate is continuously attached, thereby making it difficult to unload the substrate. However, according to embodiments, since a part of a top surface of a substrate supporting plate (e.g., an edge of the substrate supporting plate that contacts a substrate) is anodized, a process gas may be prevented from penetrating into a rear surface of the substrate and the substrate that is closely attached to the substrate supporting plate due to an electrostatic force may be more easily unloaded.

In an optional embodiment, since an edge of a substrate supporting plate that contacts a substrate is anodized, an insulating layer (e.g., an insulating layer made of aluminum oxide) having a ring shape (e.g., a quadrangular ring shape or a circular ring shape) may be formed on the substrate supporting plate. A width of the insulating layer formed on the substrate supporting plate may be determined through experiments.

Figure 6:
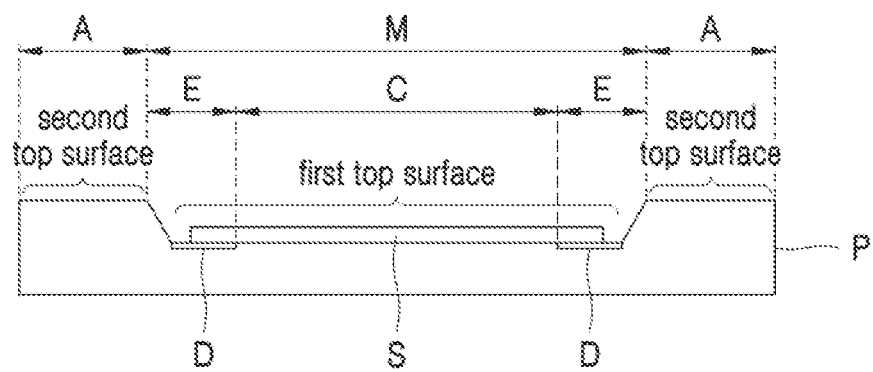
FIGS. 6 and 7 are respectively a cross-sectional view and a plan view of the substrate supporting plate according to embodiments.
Figure 7:
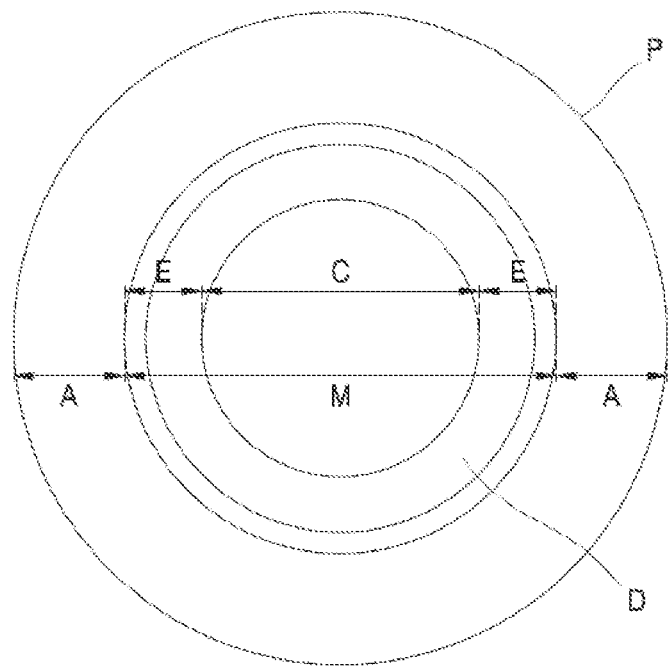

FIGS. 6 and 7 are respectively a cross-sectional view and a plan view of the substrate supporting plate P according to embodiments.

Referring to FIGS. 6 and 7, the substrate supporting plate P may include the substrate mounting portion M and the peripheral portion A surrounding the substrate mounting portion M, and the substrate mounting portion M may have a concave shape relative to the peripheral portion A as described above.

A part of an edge portion E of a top surface of the substrate mounting portion M (e.g., a portion excluding or including an inclined side wall of the edge portion E) may be anodized and a central portion C of the top surface may not be anodized. In order to locate the target substrate S so that the target substrate S overlaps the anodized part, an area of the central portion C may be less than an area of the target substrate S. The peripheral portion A may not be anodized as shown in FIG. 6, or at least a part of the peripheral portion A may be anodized (see FIGS. 8, 12, 14, and 15).

As the edge portion E is anodized, an insulating layer D may be formed on the top surface of the edge portion E. When the target substrate S has a circular shape like a wafer, the insulating layer D may be formed to have a circular ring shape. In contrast, when the target substrate S has a quadrangular shape like a display panel, the insulating layer D may be formed to have a quadrangular ring shape. That is, the insulating layer D formed due to anodizing may be formed to have a ring shape conforming to a shape of the target substrate S.

In an embodiment, the substrate supporting plate P may include a metal, and an insulating layer (e.g., a metal oxide layer) may be formed by anodizing the metal. For example, the substrate supporting plate P may include aluminum, and an aluminum oxide layer may be formed due to anodizing. A thickness of the aluminum oxide layer may range from about 10 μm to about 100 μm, for example, from about 15 μm to about 45 μm.

According to embodiments, a part (e.g., an edge) of the substrate supporting plate P such as a susceptor that contacts the target substrate S is anodized and the target substrate S is disposed to overlap the insulating layer D that is formed due to the anodizing. Accordingly, the target substrate S and the substrate supporting plate P may be closely attached to each other, and thus a process gas may be prevented from penetrating therebetween during a plasma process and problems such as contamination of a reactor, a device yield drop, and contamination in a subsequent process due to deposition on a rear surface of the target substrate S may be avoided. Also, since the substrate supporting plate P is partially anodized and the target substrate S overlaps the insulating layer D that is formed due to the anodizing, the target substrate S may be easily unloaded after a process.

Figure 8:
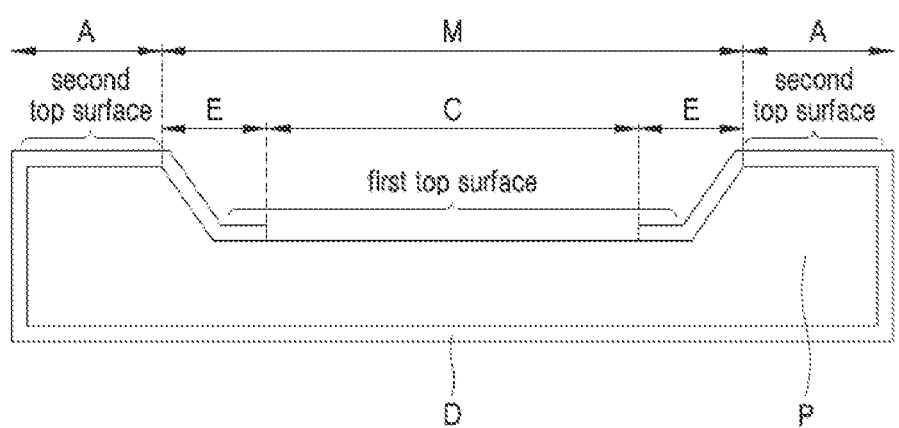
FIG. 8 is a cross-sectional view of the substrate supporting plates according to other embodiments.

FIG. 8 is a cross-sectional view of the substrate supporting plate P according to other embodiments.

Referring to FIG. 8, the substrate supporting plate P may include a top surface, a bottom surface, and a side surface, and the insulating layer D may be formed on at least a part of the top surface, the bottom surface, and the side surface of the substrate supporting plate P. The insulating layer D may be formed by the anodizing.

In order to form the substrate supporting plate P of FIG. 8, the insulating layer D may be formed on the substrate supporting plate P and then a part of the insulating layer D may be removed. For example, a mechanical removal process may be performed on a portion (not shown) formed on the central portion C, from among portions of the insulating layer D formed on a top surface of the substrate mounting portion M of the substrate supporting plate P, to expose a metal surface of the substrate supporting plate P. As a result, the insulating layer D may have a stepped shape that protrudes from an exposed top surface of the substrate supporting plate P. The target substrate S and the substrate supporting plate P may be more closely attached to each other due to the stepped shape.

A method of depositing a thin film by using the substrate supporting plate P of FIGS. 6 through 8 may include the following steps.

First step: The target substrate S is mounted on the substrate supporting plate P. As described above, the insulating layer D that is formed due to anodizing is formed on the substrate supporting plate P to partially overlap the target substrate S, and thus the target substrate S overlaps the insulating layer D.

Second step: The target substrate S is closely attached to the substrate supporting plate P by using charges accumulated on the target substrate S. The target substrate S may be closely attached to the substrate supporting plate P due to an electrostatic force between the target substrate S and the substrate supporting plate P including the insulating layer D (in particular, an electrostatic force produced at a position where the target substrate S and the insulating layer D overlap each other). In this step, charges may be accumulated during deposition process of the target substrate S.

Third step: A first thin film is deposited on the target substrate S. The first thin film may be deposited by using a PE-ALD process. For example, the first thin film may be deposited by supplying a first gas, removing the first gas that remains by supplying a purge gas, supplying a second gas and plasma, and removing the second gas that remains by supplying the purge gas. In an optional embodiment, the first gas or the second gas may be a reactive purge gas. Optionally, the second step may be carried out during the third step.

In this embodiment, the second step and the third step may be performed simultaneously, so that the target substrate S may be closely attached to the substrate supporting plate P. During the plasma deposition process, the target substrate S may be charged (i.e. charges may be accumulated in the target substrate S). This results in polarization of an anodized insulating layer D, D' of the substrate supporting plate P. Because of the polarization, electrostatic force between the target substrate S and the substrate supporting plate P may be generated. The electrostatic force leads to the close attachment between the target substrate S and the substrate supporting plate P.

Fourth step: The second step and/or the third step is repeatedly performed until a thin film having a predetermined thickness is formed.

Fifth step: The target substrate S on which the thin film is completely deposited is unloaded.

The thin film may be deposited on the target substrate S by performing the first through fifth steps. During the third step of depositing the first thin film, a second thin film may be formed on a rear surface of the target substrate S. Since the second thin film contaminates a device formed on the target substrate S, diffuses contamination particles in a reaction space when the target substrate S is unloaded, and thus contaminates a reactor (and equipment in a subsequent process), the second thin film has to be formed as small as possible. In order to make the second thin film as small as possible, the second thin film has to be formed in consideration of an edge exclusion portion that is a penetration allowable range. In other words, a width of the second thin film may be less than a width of the edge exclusion portion.

Figure 9:
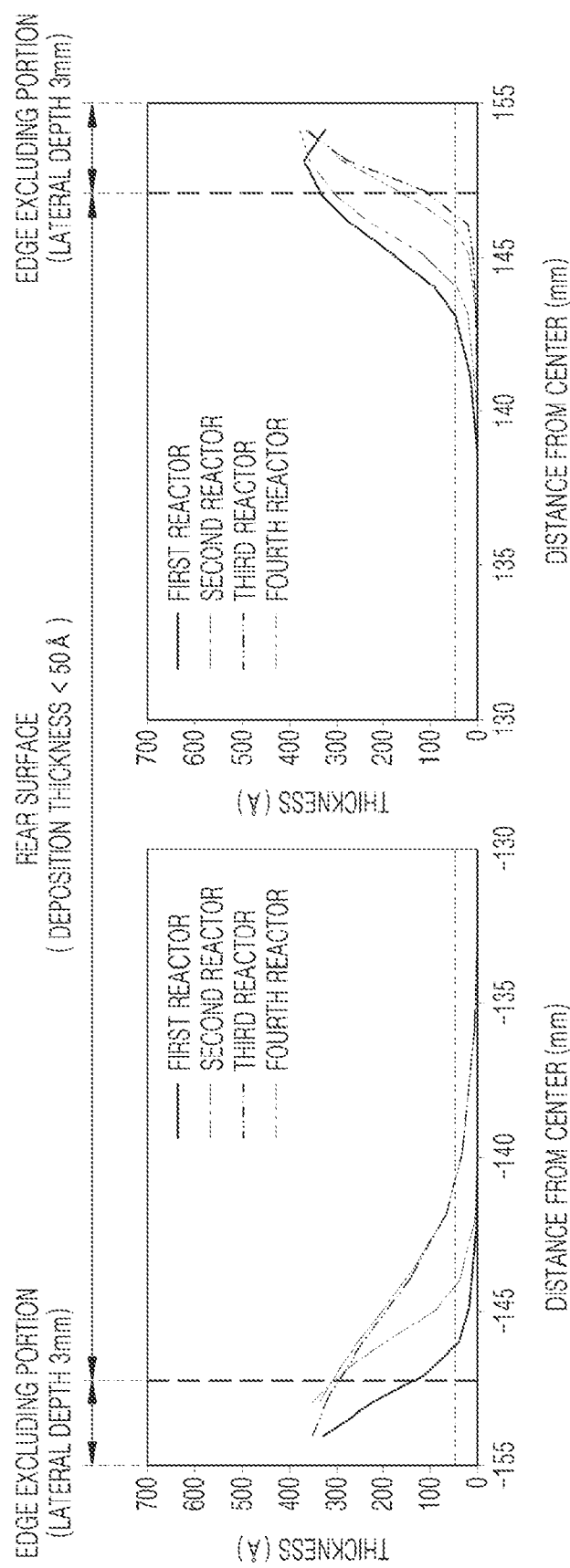
FIGS. 9 and 10 are graphs illustrating a thickness of a thin film deposited on a rear surface of a substrate when a substrate supporting plate was not anodized and when an edge of the substrate supporting plate was anodized.
Figure 10:
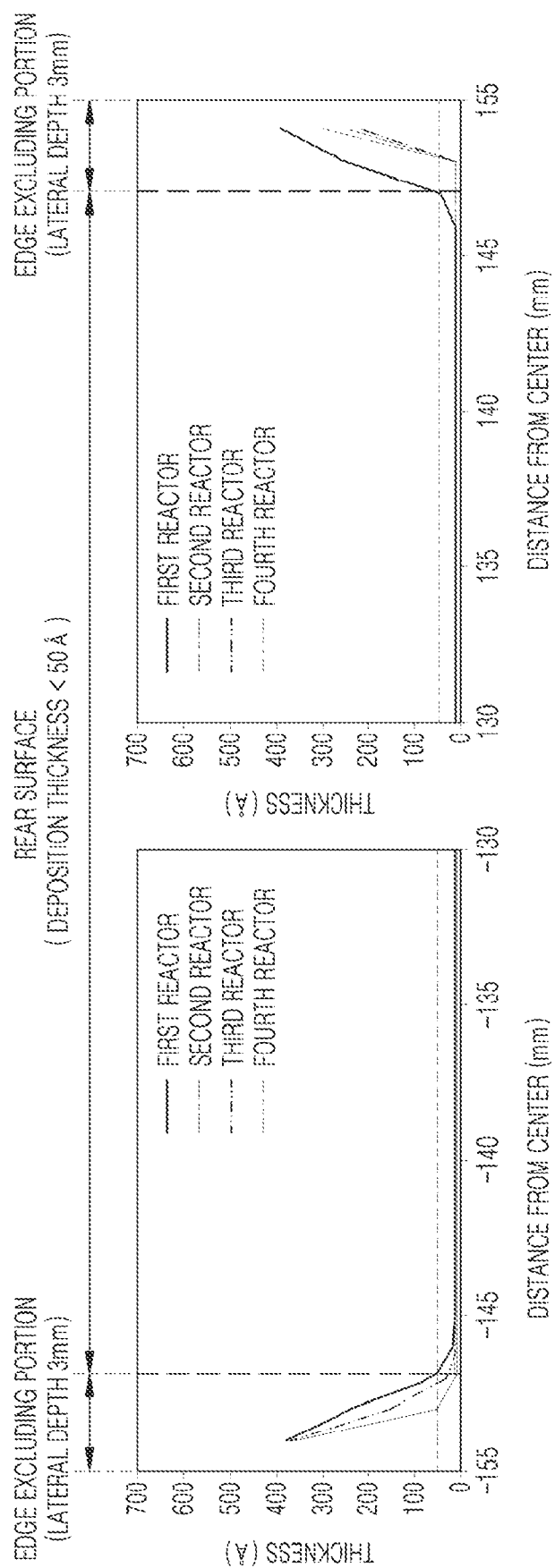

FIGS. 9 and 10 are graphs showing data of an experiment illustrating a thickness of a thin film deposited on a rear surface of a substrate when a substrate supporting plate was not anodized (FIG. 9) and when an edge of the substrate supporting plate was anodized (FIG. 10). In FIGS. 9 and 10, the vertical axis represents the thickness of the thin film deposited on the rear surface of the substrate and the horizontal axis represents a distance (mm) from the center of the rear surface of the substrate to an edge. In FIGS. 9 and 10, the substrate having a diameter of 300 mm was used, and the horizontal axis shows 150 mm from the center of the rear surface of the substrate. That is, a leftmost end from the center of a target substrate is −150 mm and a rightmost end from the center of the target substrate is +150 mm. Also, the experiment was performed in a multi-camber including four reactors, and each line shows a measurement result in each of the four reactors.

Referring to FIG. 9 illustrating the thickness of the thin film deposited on the rear surface of the substrate where the substrate supporting plate was not anodized, penetration was made to a lateral depth of 15 mm and the thin film was formed on the rear surface of the substrate. In contrast, referring to FIG. 10 illustrating the thickness of the thin film deposited on the rear surface of the substrate when the edge of the substrate supporting plate that contacts the substrate was anodized to a width of 40 mm, penetration was made to a lateral depth of 3 mm of the rear surface of the substrate. The lateral depth of 3 mm is within a 3 mm-range of an edge exclusion portion that is a penetration allowable range, and thus there is no problem. Also, since only the edge of the substrate supporting plate was anodized, a force of a substrate supporting pin to lift the target substrate S from the substrate supporting plate after a process may be greater than an adhesive force between the target substrate S and the substrate supporting plate, thereby making it easy to unload the target substrate S.

FIGS. 11 through 15 are cross-sectional views of the substrate supporting plates P according to other embodiments.

Figure 11:
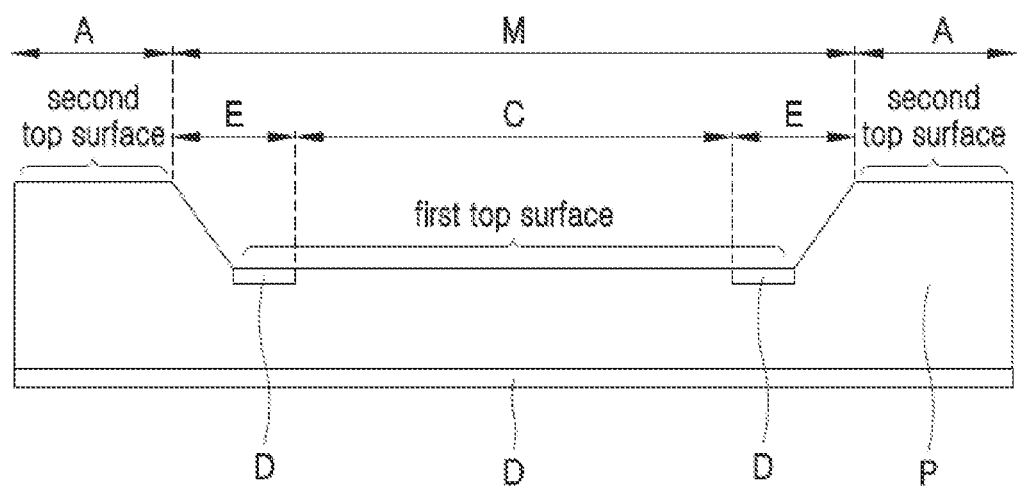
FIGS. 11 through 15 are cross-sectional views of the substrate supporting plates according to other embodiments.

Referring to FIG. 11, the substrate supporting plate P may include the insulating layer D' obtained by anodizing at least a part of a bottom surface that is opposite to a top surface. Since the insulating layer D' is formed on the bottom surface, an adhesive force between the substrate supporting plate P including the insulating layer D' and the target substrate S may increase. Although the entire bottom surface of the substrate supporting plate P is anodized in FIG. 11, only a part of the bottom surface may be anodized. Although a side surface of the substrate supporting plate P is not anodized in FIG. 11, in an optional embodiment, the side surface of the substrate supporting plate P may also be anodized.

Figure 12:
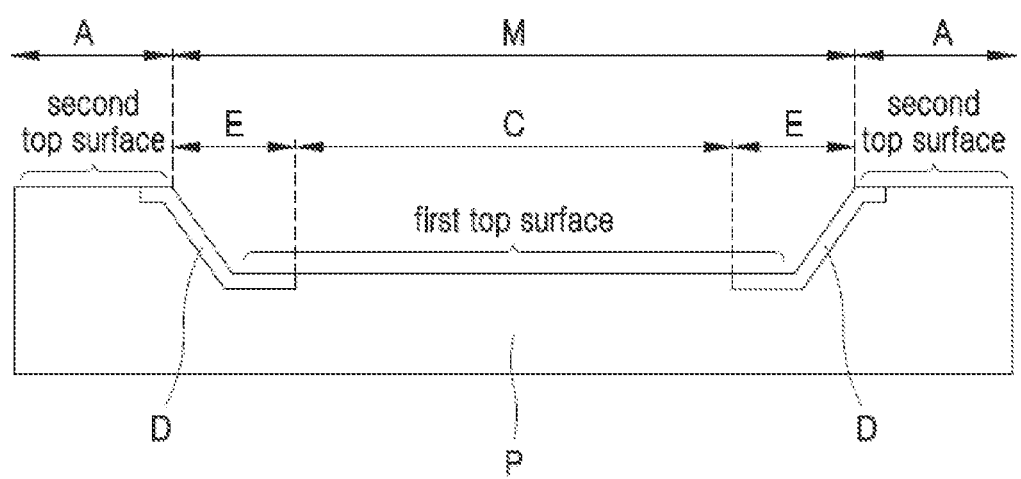
Figure 13:
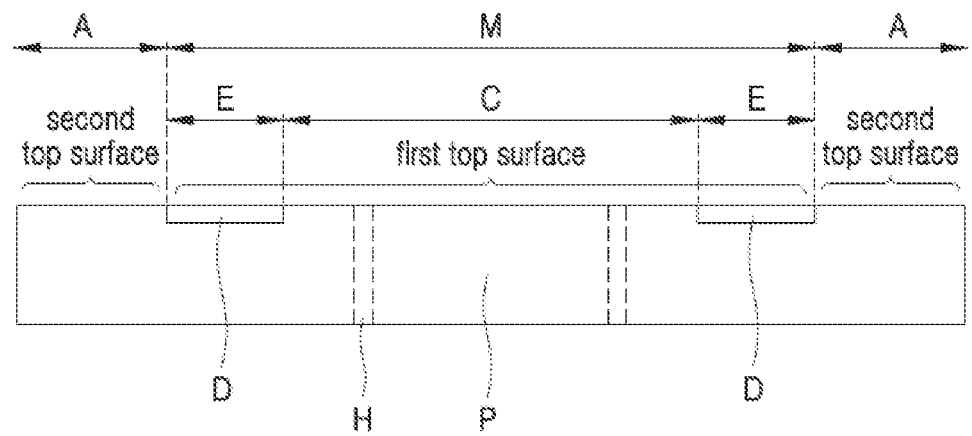

Referring to FIG. 12, the insulating layer D that is formed due to anodizing may be formed on the peripheral portion A as well as on the substrate mounting portion M of the substrate supporting plate P. Also, as shown in FIG. 13, the substrate mounting portion M of the substrate supporting plate P may be flat like the peripheral portion A, and the substrate supporting pin hole H may be formed in the central portion C of the substrate mounting portion M. In an optional embodiment, the substrate supporting pin hole H may be formed in the edge portion E of the substrate mounting portion M or may be formed in the peripheral portion A.

Figure 14:
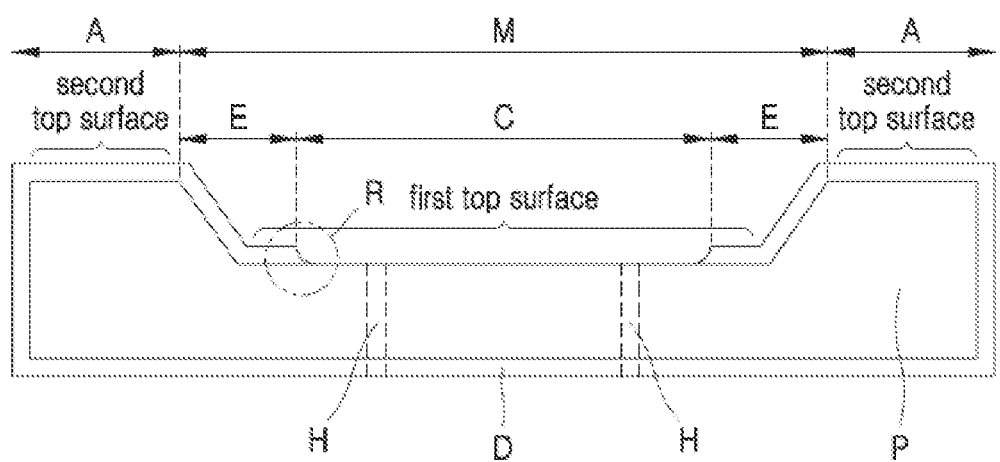

Referring to FIG. 14, a protruding side wall of the insulating layer D of the substrate supporting late may have a round profile R. The round profile R may be formed when a mechanical removal method of mechanically removing a part of the insulating layer D after the insulating layer D is formed changes to a chemical removal method (e.g., a method using wet etching). Since the insulating layer D that protrudes through wet etching has a round profile, an adhesive force between the substrate supporting plate P including the insulating layer D and the target substrate S may increase.

Figure 15:
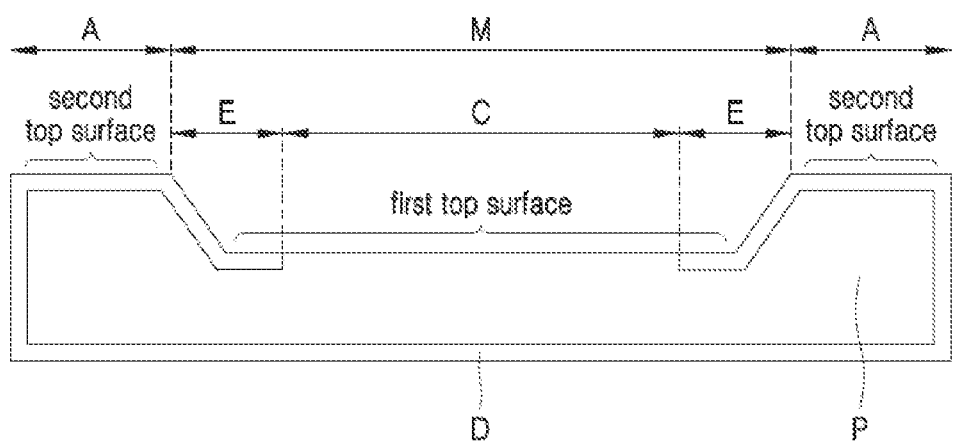

Referring to FIG. 15, a top surface of the insulating layer D of the substrate supporting plate P may be formed at substantially the same level as that of a top surface of an exposed metal layer of the substrate supporting plate P. Such a structure may be formed by forming the substrate supporting plate P by performing the following steps, instead of the above process of mechanically removing a part of the insulating layer D after the insulating layer D is formed.

First step: A mask is formed on the central portion C of the substrate mounting portion M of the substrate supporting plate P.

Second step: The substrate supporting plate P on which the mask is formed is subjected to surface treatment to form the insulating layer D (that is, the insulating layer D spreads to a predetermined depth into a portion of the substrate supporting plate P where the mask is not formed).

Third step: The mask is removed.

That is, the substrate supporting plate P may be formed by optionally performing surface treatment by using the mask, instead of the above process of mechanically removing a part of the insulating layer D. In an optional embodiment, due to the surface treatment, a metal of the substrate supporting plate P may be changed into an insulating material with a volume increased, and in this case, a top surface of the insulating layer D may be higher than a top surface of an exposed metal layer of the substrate supporting plate P.

Embodiments should not be construed as limited to the particular shapes of portions illustrated herein for better understanding of the present disclosure but may be to include deviations in shapes.

While one or more embodiments have been described with reference to the figures, it will be understood by one of ordinary skill in the art that various changes in form and details may be made therein without departing from the spirit and scope of the disclosure as defined by the following claims.

What is claimed is:

1. A method comprising:
mounting a target substrate to be processed on a mounting portion of a substrate supporting plate, the substrate supporting plate comprising a top surface, the top surface comprising a non-anodized central portion and an anodized edge portion about the non-anodized central portion, wherein the anodized edge portion is configured to overlap at least a portion of the target substrate when the target substrate is placed on the substrate supporting plate;
attaching the target substrate to the substrate supporting plate using charges accumulated on the target substrate while processing the target substrate; and
unloading the target substrate.

2. The method of claim 1, wherein the processing the target substrate comprises a deposition process.

3. The method of claim 2, wherein the deposition process comprises a plasma-enhanced deposition process.

4. The method of claim 2, wherein the deposition process comprises a plasma-enhanced atomic layer deposition process.

5. The method of claim 1, comprising:
supplying a first gas;
removing the first gas by supplying a purge gas;
supplying a second gas; and
removing the second gas by supplying the purge gas.

6. The method of claim 5, comprising a step of forming a plasma during the step of supplying the second gas.

7. The method of claim 5, wherein one or more of the first gas or the second gas comprises a reactive gas.

8. The method of claim 5, wherein the steps of removing the first gas and supplying the second gas are performed at a same time.

9. The method of claim 5, wherein the steps of removing the first gas and supplying the second gas are repeated a number of times.

10. The method of claim 1, wherein the non-anodized central portion exposes a metallic surface configured to face the target substrate.

11. The method of claim 10, wherein the metallic surface exists as the non-anodized central portion and an insulating layer is formed on the edge portion and is not formed on the central portion of the top surface to allow the target substrate to be detached after a process ends.

12. The method of claim 11, wherein a thickness of the insulating layer is from about 10 μm to about 100 μm.

13. The method of claim 1, wherein the supporting plate comprises a peripheral portion surrounding the mounting portion.

14. The method of claim 13, wherein the supporting plate comprises an inclined surface between a surface of the mounting portion and a surface of the peripheral portion.

15. The method of claim 1, wherein the non-anodized central portion and the edge together are sized to accommodate the target substrate such that an area of the non-anodized central portion is less than an area of the target substrate.

16. The method of claim 1, further comprising moving a pin through the substrate supporting plate.

17. The method of claim 1, further comprising injecting a gas by a gas channel and a gas injection device onto the target substrate on the substrate supporting plate, wherein at least a part of the injected gas is externally discharged through a gas flow control device.

18. The method of claim 1, wherein the anodized edge portion comprises a thickness ranging from about 10 μm to about 100 μm.

19. The method of claim 1, wherein the anodized edge portion comprises an aluminum oxide layer having a thickness of about 15 μm to about 45 μm.

20. A method for mitigating deposition on a rear surface of a substrate comprising the method of claim 1.

* * * * *